(12) United States Patent
Milevski et al.

(10) Patent No.: US 10,888,039 B2
(45) Date of Patent: Jan. 5, 2021

(54) SHIELDED CASE FOR WIRELESS EARPIECES

(71) Applicant: BRAGI GmbH, Munich (DE)

(72) Inventors: Veniamin Milevski, Munich (DE); Diego Bestilleiro Amado, Munich (DE)

(73) Assignee: BRAGI GmbH, Munich (DE)

( * ) Notice: Subject to any disclaimer, the term of this patent is extended or adjusted under 35 U.S.C. 154(b) by 0 days.

(21) Appl. No.: 15/639,661

(22) Filed: Jun. 30, 2017

(65) Prior Publication Data
US 2018/0014436 A1 Jan. 11, 2018

Related U.S. Application Data

(60) Provisional application No. 62/358,779, filed on Jul. 6, 2016.

(51) Int. Cl.
H05K 9/00 (2006.01)
H04R 1/10 (2006.01)

(52) U.S. Cl.
CPC ......... H05K 9/0007 (2013.01); H04R 1/1025 (2013.01); H05K 9/0086 (2013.01); H04R 1/10 (2013.01); H04R 1/1016 (2013.01); H04R 2420/07 (2013.01); H04R 2460/17 (2013.01)

(58) Field of Classification Search
CPC .. H05K 9/0007; H05K 9/0086; H04R 1/1091; H04R 1/02; H04R 2460/17; H04R 1/10; H04R 25/65; H02J 7/0044; H04M 1/06
See application file for complete search history.

(56) References Cited

U.S. PATENT DOCUMENTS

| 2,325,590 | A | 8/1943 | Carlisle et al. |
| 2,430,229 | A | 11/1947 | Kelsey |
| 3,047,089 | A | 7/1962 | Zwislocki |
| D208,784 | S | 10/1967 | Sanzone |
| 3,586,794 | A | 6/1971 | Michaelis |
| 3,934,100 | A | 1/1976 | Harada |

(Continued)

FOREIGN PATENT DOCUMENTS

| CN | 204244472 U | 4/2015 |
| CN | 104683519 A | 6/2015 |

(Continued)

OTHER PUBLICATIONS

Akkermans, "Acoustic Ear Recognition for Person Identification", Automatic Identification Advanced Technologies, 2005 pp. 219-223.

(Continued)

Primary Examiner — James Wu
(74) Attorney, Agent, or Firm — Goodhue, Coleman & Owens, P.C.

(57) ABSTRACT

An apparatus includes a ear piece case housing, a receptacle within the ear piece case housing and configured to hold an earpiece, an earpiece connector at the receptacle and configured to electrically connect with the earpiece, and electromagnetic shielding materials integrated into the ear piece case housing to electromagnetically isolate the earpiece while the earpiece is contained within the case housing. The ear piece case housing may include a charger and a removable slide cover adapted for sliding over the charger.

15 Claims, 5 Drawing Sheets

(56) References Cited

U.S. PATENT DOCUMENTS

| | | |
|---|---|---|
| 3,983,336 A | 9/1976 | Malek et al. |
| 4,069,400 A | 1/1978 | Johanson et al. |
| 4,150,262 A | 4/1979 | Ono |
| 4,334,315 A | 6/1982 | Ono et al. |
| D266,271 S | 9/1982 | Johanson et al. |
| 4,375,016 A | 2/1983 | Harada |
| 4,588,867 A | 5/1986 | Konomi |
| 4,617,429 A | 10/1986 | Bellafiore |
| 4,654,883 A | 3/1987 | Iwata |
| 4,682,180 A | 7/1987 | Gans |
| 4,791,673 A | 12/1988 | Schreiber |
| 4,852,177 A | 7/1989 | Ambrose |
| 4,865,044 A | 9/1989 | Wallace et al. |
| 4,984,277 A | 1/1991 | Bisgaard et al. |
| 5,008,943 A | 4/1991 | Arndt et al. |
| 5,185,802 A | 2/1993 | Stanton |
| 5,191,602 A | 3/1993 | Regen et al. |
| 5,201,007 A | 4/1993 | Ward et al. |
| 5,201,008 A | 4/1993 | Arndt et al. |
| D340,286 S | 10/1993 | Seo |
| 5,280,524 A | 1/1994 | Norris |
| 5,295,193 A | 3/1994 | Ono |
| 5,298,692 A | 3/1994 | Ikeda et al. |
| 5,343,532 A | 8/1994 | Shugart |
| 5,347,584 A | 9/1994 | Narisawa |
| 5,363,444 A | 11/1994 | Norris |
| D367,113 S | 2/1996 | Weeks |
| 5,497,339 A | 3/1996 | Bernard |
| 5,606,621 A | 2/1997 | Reiter et al. |
| 5,613,222 A | 3/1997 | Guenther |
| 5,654,530 A | 8/1997 | Sauer et al. |
| 5,692,059 A | 11/1997 | Kruger |
| 5,721,783 A | 2/1998 | Anderson |
| 5,748,743 A | 5/1998 | Weeks |
| 5,749,072 A | 5/1998 | Mazurkiewicz et al. |
| 5,771,438 A | 6/1998 | Palermo et al. |
| D397,796 S | 9/1998 | Yabe et al. |
| 5,802,167 A | 9/1998 | Hong |
| D410,008 S | 5/1999 | Almqvist |
| 5,929,774 A | 7/1999 | Charlton |
| 5,933,506 A | 8/1999 | Aoki et al. |
| 5,949,896 A | 9/1999 | Nageno et al. |
| 5,987,146 A | 11/1999 | Pluvinage et al. |
| 6,021,207 A | 2/2000 | Puthuff et al. |
| 6,054,989 A | 4/2000 | Robertson et al. |
| 6,081,724 A | 6/2000 | Wilson |
| 6,094,492 A | 7/2000 | Boesen |
| 6,111,569 A | 8/2000 | Brusky et al. |
| 6,112,103 A | 8/2000 | Puthuff |
| 6,121,544 A * | 9/2000 | Petsinger ............ G06K 19/005 150/147 |
| 6,157,727 A | 12/2000 | Rueda |
| 6,167,039 A | 12/2000 | Karlsson et al. |
| 6,181,801 B1 | 1/2001 | Puthuff et al. |
| 6,208,372 B1 | 3/2001 | Barraclough |
| 6,230,029 B1 | 5/2001 | Yegiazaryan et al. |
| 6,275,789 B1 | 8/2001 | Moser et al. |
| 6,339,754 B1 | 1/2002 | Flanagan et al. |
| D455,835 S | 4/2002 | Anderson et al. |
| 6,408,081 B1 | 6/2002 | Boesen |
| 6,424,820 B1 | 7/2002 | Burdick et al. |
| D464,039 S | 10/2002 | Boesen |
| 6,470,893 B1 | 10/2002 | Boesen |
| D468,299 S | 1/2003 | Boesen |
| D468,300 S | 1/2003 | Boesen |
| 6,542,721 B2 | 4/2003 | Boesen |
| 6,560,468 B1 | 5/2003 | Boesen |
| 6,654,721 B2 | 11/2003 | Handelman |
| 6,664,713 B2 | 12/2003 | Boesen |
| 6,690,807 B1 | 2/2004 | Meyer |
| 6,694,180 B1 | 2/2004 | Boesen |
| 6,718,043 B1 | 4/2004 | Boesen |
| 6,738,485 B1 | 5/2004 | Boesen |
| 6,748,095 B1 | 6/2004 | Goss |
| 6,754,358 B1 | 6/2004 | Boesen et al. |
| 6,784,873 B1 | 8/2004 | Boesen et al. |
| 6,823,195 B1 | 11/2004 | Boesen |
| 6,852,084 B1 | 2/2005 | Boesen |
| 6,879,698 B2 | 4/2005 | Boesen |
| 6,892,082 B2 | 5/2005 | Boesen |
| 6,920,229 B2 | 7/2005 | Boesen |
| 6,952,483 B2 | 10/2005 | Boesen et al. |
| 6,987,986 B2 | 1/2006 | Boesen |
| 7,010,137 B1 | 3/2006 | Leedom et al. |
| 7,113,611 B2 | 9/2006 | Leedom et al. |
| D532,520 S | 11/2006 | Kampmeier et al. |
| 7,136,282 B1 | 11/2006 | Rebeske |
| 7,203,331 B2 | 4/2007 | Boesen |
| 7,209,569 B2 | 4/2007 | Boesen |
| 7,215,790 B2 | 5/2007 | Boesen et al. |
| D549,222 S | 8/2007 | Huang |
| D554,756 S | 11/2007 | Sjursen et al. |
| 7,403,629 B1 | 7/2008 | Aceti et al. |
| D579,006 S | 10/2008 | Kim et al. |
| 7,463,902 B2 | 12/2008 | Boesen |
| 7,508,411 B2 | 3/2009 | Boesen |
| D601,134 S | 9/2009 | Elabidi et al. |
| 7,825,626 B2 | 11/2010 | Kozisek |
| 7,965,855 B1 | 6/2011 | Ham |
| 7,979,035 B2 | 7/2011 | Griffin et al. |
| 7,983,628 B2 | 7/2011 | Boesen |
| D647,491 S | 10/2011 | Chen et al. |
| 8,095,188 B2 | 1/2012 | Shi |
| 8,108,143 B1 | 1/2012 | Tester |
| 8,140,357 B1 | 3/2012 | Boesen |
| D666,581 S | 9/2012 | Perez |
| 8,300,864 B2 | 10/2012 | Mullenborn et al. |
| 8,406,448 B2 | 3/2013 | Lin et al. |
| 8,436,780 B2 | 5/2013 | Schantz et al. |
| D687,021 S | 7/2013 | Yuen |
| 8,719,877 B2 | 5/2014 | VonDoenhoff et al. |
| 8,774,434 B2 | 7/2014 | Zhao et al. |
| 8,831,266 B1 | 9/2014 | Huang |
| 8,891,800 B1 * | 11/2014 | Shaffer ................ H04R 1/1025 379/437 |
| 8,994,498 B2 | 3/2015 | Agrafioti et al. |
| D728,107 S | 4/2015 | Martin et al. |
| 9,013,145 B2 | 4/2015 | Castillo et al. |
| 9,037,125 B1 | 5/2015 | Kadous |
| D733,103 S | 6/2015 | Jeong et al. |
| 9,081,944 B2 | 7/2015 | Camacho et al. |
| 9,510,159 B1 | 11/2016 | Cuddihy et al. |
| D773,439 S | 12/2016 | Walker |
| D775,158 S | 12/2016 | Dong et al. |
| D777,710 S | 1/2017 | Palmborg et al. |
| D788,079 S | 5/2017 | Son et al. |
| 2001/0005197 A1 | 6/2001 | Mishra et al. |
| 2001/0027121 A1 | 10/2001 | Boesen |
| 2001/0043707 A1 | 11/2001 | Leedom |
| 2001/0056350 A1 | 12/2001 | Calderone et al. |
| 2002/0002413 A1 | 1/2002 | Tokue |
| 2002/0007510 A1 | 1/2002 | Mann |
| 2002/0010590 A1 | 1/2002 | Lee |
| 2002/0030637 A1 | 3/2002 | Mann |
| 2002/0046035 A1 | 4/2002 | Kitahara et al. |
| 2002/0057810 A1 | 5/2002 | Boesen |
| 2002/0076073 A1 | 6/2002 | Taenzer et al. |
| 2002/0118852 A1 | 8/2002 | Boesen |
| 2003/0002705 A1 | 1/2003 | Boesen |
| 2003/0065504 A1 | 4/2003 | Kraemer et al. |
| 2003/0100331 A1 | 5/2003 | Dress et al. |
| 2003/0104806 A1 | 6/2003 | Ruef et al. |
| 2003/0115068 A1 | 6/2003 | Boesen |
| 2003/0125096 A1 | 7/2003 | Boesen |
| 2003/0218064 A1 | 11/2003 | Conner et al. |
| 2004/0070564 A1 | 4/2004 | Dawson et al. |
| 2004/0160511 A1 | 8/2004 | Boesen |
| 2005/0017842 A1 | 1/2005 | Dematteo |
| 2005/0043056 A1 | 2/2005 | Boesen |
| 2005/0059344 A1 * | 3/2005 | Chang .................. H02J 7/0042 455/41.1 |
| 2005/0125320 A1 | 6/2005 | Boesen |
| 2005/0148883 A1 | 7/2005 | Boesen |
| 2005/0165663 A1 | 7/2005 | Razumov |

(56) References Cited

U.S. PATENT DOCUMENTS

| | | |
|---|---|---|
| 2005/0196009 A1 | 9/2005 | Boesen |
| 2005/0251455 A1 | 11/2005 | Boesen |
| 2005/0266876 A1 | 12/2005 | Boesen |
| 2006/0029246 A1 | 2/2006 | Boesen |
| 2006/0074671 A1 | 4/2006 | Farmaner et al. |
| 2006/0074808 A1 | 4/2006 | Boesen |
| 2006/0166715 A1 | 7/2006 | Engelen et al. |
| 2006/0166716 A1 | 7/2006 | Seshadri et al. |
| 2006/0220915 A1 | 10/2006 | Bauer |
| 2006/0258412 A1 | 11/2006 | Liu |
| 2008/0076972 A1 | 3/2008 | Dorogusker et al. |
| 2008/0090622 A1 | 4/2008 | Kim et al. |
| 2008/0146890 A1 | 6/2008 | LeBoeuf et al. |
| 2008/0254780 A1 | 10/2008 | Kuhl et al. |
| 2008/0255430 A1 | 10/2008 | Alexandersson et al. |
| 2009/0003620 A1 | 1/2009 | McKillop et al. |
| 2009/0017881 A1 | 1/2009 | Madrigal |
| 2009/0073070 A1 | 3/2009 | Rofougaran |
| 2009/0097689 A1 | 4/2009 | Prest et al. |
| 2009/0105548 A1 | 4/2009 | Bart |
| 2009/0191920 A1 | 7/2009 | Regen et al. |
| 2009/0245559 A1 | 10/2009 | Boltyenkov et al. |
| 2009/0296968 A1 | 12/2009 | Wu et al. |
| 2010/0033313 A1 | 2/2010 | Keady et al. |
| 2010/0203831 A1 | 8/2010 | Muth |
| 2010/0210212 A1 | 8/2010 | Sato |
| 2010/0320961 A1 | 12/2010 | Castillo et al. |
| 2011/0286615 A1 | 11/2011 | Olodort et al. |
| 2012/0057740 A1 | 3/2012 | Rosal |
| 2012/0073873 A1* | 3/2012 | Nash ............... H05K 9/0045 174/382 |
| 2013/0316642 A1 | 11/2013 | Newham |
| 2013/0346168 A1 | 12/2013 | Zhou et al. |
| 2014/0079257 A1 | 3/2014 | Ruwe et al. |
| 2014/0106677 A1 | 4/2014 | Altman |
| 2014/0122116 A1 | 5/2014 | Smythe |
| 2014/0163771 A1 | 6/2014 | Demeniuk |
| 2014/0185828 A1 | 7/2014 | Helbling |
| 2014/0222462 A1 | 8/2014 | Shakil et al. |
| 2014/0235169 A1 | 8/2014 | Parkinson et al. |
| 2014/0270227 A1 | 9/2014 | Swanson |
| 2014/0270271 A1 | 9/2014 | Dehe et al. |
| 2014/0348367 A1 | 11/2014 | Vavrus et al. |
| 2015/0028996 A1 | 1/2015 | Agrafioti et al. |
| 2015/0110587 A1 | 4/2015 | Hori |
| 2015/0148989 A1 | 5/2015 | Cooper et al. |
| 2015/0245127 A1* | 8/2015 | Shaffer ............. H04R 1/1025 381/380 |
| 2016/0033280 A1 | 2/2016 | Moore et al. |
| 2016/0072558 A1 | 3/2016 | Hirsch et al. |
| 2016/0073189 A1* | 3/2016 | Linden ............. H04R 1/1025 381/74 |
| 2016/0125892 A1 | 5/2016 | Bowen et al. |
| 2016/0323681 A1* | 11/2016 | Kim ..................... H04R 25/00 |
| 2016/0360350 A1 | 12/2016 | Watson et al. |
| 2017/0078780 A1 | 3/2017 | Qian et al. |
| 2017/0094391 A1* | 3/2017 | Panecki ............... A45C 13/02 |
| 2017/0111726 A1 | 4/2017 | Martin et al. |
| 2017/0155992 A1 | 6/2017 | Perianu et al. |

FOREIGN PATENT DOCUMENTS

| | | |
|---|---|---|
| CN | 104837094 A | 8/2015 |
| EP | 1469659 A1 | 10/2004 |
| EP | 1017252 A3 | 5/2006 |
| EP | 2903186 A1 | 8/2015 |
| GB | 2074817 | 4/1981 |
| GB | 2508226 A | 5/2014 |
| JP | 06292195 | 10/1998 |
| WO | 2008103925 A1 | 8/2008 |
| WO | 2007034371 A3 | 11/2008 |
| WO | 2011001433 A2 | 1/2011 |
| WO | 2012071127 A1 | 5/2012 |
| WO | 2013134956 A1 | 9/2013 |
| WO | 2014043179 A2 | 3/2014 |
| WO | 2014046602 A1 | 3/2014 |
| WO | 2015061633 A2 | 4/2015 |
| WO | 2015110577 A1 | 7/2015 |
| WO | 2015110587 A1 | 7/2015 |
| WO | 2016032990 A1 | 3/2016 |

OTHER PUBLICATIONS

Announcing the $3,333,333 Stretch Goal (Feb. 24, 2014).

Ben Coxworth: "Graphene-based ink could enable low-cost, foldable electronics", "Journal of Physical Chemistry Letters", Northwestern University, (May 22, 2013).

Blain: "World's first graphene speaker already superior to Sennheiser MX400", htt://www.gizmag.com/graphene-speaker-beats-sennheiser-mx400/31660, (Apr. 15, 2014).

BMW, "BMW introduces BMW Connected—The personalized digital assistant", "http://bmwblog.com/2016/01/05/bmw-introduces-bmw-connected-the-personalized-digital-assistant", (Jan. 5, 2016).

BRAGI is on Facebook (2014).

BRAGI Update—Arrival of Prototype Chassis Parts—More People—Awesomeness (May 13, 2014).

BRAGI Update—Chinese New Year, Design Verification, Charging Case, More People, Timeline(Mar. 6, 2015).

BRAGI Update—First Sleeves From Prototype Tool—Software Development Kit (Jun. 5, 2014).

BRAGI Update—Let's Get Ready to Rumble, A Lot to Be Done Over Christmas (Dec. 22, 2014).

BRAGI Update—Memories From April—Update on Progress (Sep. 16, 2014).

BRAGI Update—Memories from May—Update on Progress—Sweet (Oct. 13, 2014).

BRAGI Update—Memories From One Month Before Kickstarter—Update on Progress (Jul. 10, 2014).

BRAGI Update—Memories From the First Month of Kickstarter—Update on Progress (Aug. 1, 2014).

BRAGI Update—Memories From the Second Month of Kickstarter—Update on Progress (Aug. 22, 2014).

BRAGI Update—New People @BRAGI—Prototypes (Jun. 26, 2014).

BRAGI Update—Office Tour, Tour to China, Tour to CES (Dec. 11, 2014).

BRAGI Update—Status on Wireless, Bits and Pieces, Testing—Oh Yeah, Timeline(Apr. 24, 2015).

BRAGI Update—The App Preview, The Charger, The SDK, BRAGI Funding and Chinese New Year (Feb. 11, 2015).

BRAGI Update—What We Did Over Christmas, Las Vegas & CES (Jan. 19, 2014).

BRAGI Update—Years of Development, Moments of Utter Joy and Finishing What We Started(Jun. 5, 2015).

BRAGI Update—Alpha 5 and Back to China, Backer Day, on Track(May 16, 2015).

BRAGI Update—Beta2 Production and Factory Line(Aug. 20, 2015).

BRAGI Update—Certifications, Production, Ramping Up.

BRAGI Update—Developer Units Shipping and Status(Oct. 5, 2015).

BRAGI Update—Developer Units Started Shipping and Status (Oct. 19, 2015).

BRAGI Update—Developer Units, Investment, Story and Status(Nov. 2, 2015).

BRAGI Update—Getting Close(Aug. 6, 2014).

BRAGI Update—On Track, Design Verification, How It Works and What's Next(Jul. 15, 2015).

BRAGI Update—On Track, On Track and Gems Overview.

BRAGI Update—Status on Wireless, Supply, Timeline and Open House@BRAGI(Apr. 1, 2015).

BRAGI Update—Unpacking Video, Reviews on Audio Perform and Boy Are We Getting Close(Sep. 10, 2015).

Healthcare Risk Management Review, "Nuance updates computer-assisted physician documentation solution" (Oct. 20, 2016).

(56) References Cited

OTHER PUBLICATIONS

Hoyt et. al., "Lessons Learned from Implementation of Voice Recognition for Documentation in the Military Electronic Health Record System", The American Health Information Management Association (2017).
Hyundai Motor America, "Hyundai Motor Company Introduces a Health + Mobility Concept for Wellness in Mobility", Fountain Valley, Californa (2017).
Last Push Before The Kickstarter Campaign Ends on Monday 4pm CET (Mar. 28, 2014).
Nigel Whitfield: "Fake tape detectors, 'from the stands' footie and UGH? Internet of Things in my set-top box"; http://www.theregister.co.uk/2014/09/24/ibc_round_up_object_audio_dlna_iot/ (Sep. 24, 2014).
Staab, Wayne J., et al., "A One-Size Disposable Hearing Aid is Introduced", The Hearing Journal 53(4):36-41) Apr. 2000.
Stretchgoal—It's Your Dash (Feb. 14, 2014).
Stretchgoal—The Carrying Case for the Dash (Feb. 12, 2014).
Stretchgoal—Windows Phone Support (Feb. 17, 2014).
The Dash + The Charging Case & The BRAGI News (Feb. 21, 2014).
The Dash—A Word From Our Software, Mechanical and Acoustics Team + An Update (Mar. 11, 2014).
Update From BRAGI—$3,000,000—Yipee (Mar. 22, 2014).

\* cited by examiner

SHIELDED CASE FOR WIRELESS EARPIECES

PRIORITY STATEMENT

This application claims priority to U.S. Provisional Patent Application 62/358,779, filed on Jul. 6, 2016, and entitled Shielded case for wireless earpiece, hereby incorporated by reference in its entirety.

FIELD OF THE INVENTION

The present invention relates to wireless earpieces and accessories. More particularly, but not exclusively, the present invention relates to a shielded case for wireless earpieces.

BACKGROUND

Wireless earpieces may be placed within a case when not in use. However, there may be problems with doing so. For example, when not in use it may be desirable to not permit wireless connections between the earpieces and other devices. Therefore, what is needed are new improved cases for wireless earpieces.

SUMMARY

Therefore, it is a primary object, feature, or advantage of the present invention to improve over the state of the art.

It is a further object, feature, or advantage of the present invention to shield a smart case from magnetic radiation.

It is a still further object, feature, or advantage of the present invention to shield a smart case from radio frequencies.

Another object, feature, or advantage is to screen out high wavelength electromagnetic radiation.

In one implementation, an apparatus includes a smart case with at least one receptacle configured to hold an earpiece, and a slide cover composed of shielding materials to encase the smart case.

One or more of the following features may be included. The slide cover may be composed of magnetic shielding materials or RF shielding materials. A liner may be attached to the inside of the slide cover which may be scratch-resistant, magnetically shielded, RF shielded, or a combination of one or more of the aforementioned. A metal mesh configured to restrict one or more wavelengths may be attached to the inside of the slide cover, which may be printed onto the slide cover. The liner may be layered over the metal mesh.

One or more of the following features may be included. The slide cover may be include magnetic shielding materials, RF shielding materials, or both. A liner may be attached to the inside of the smart case, which may be scratch-resistant, magnetically shielded, RF shielded, or a combination of one or more of the aforementioned. A metal mesh configured to restrict one or more wavelengths may be attached to the inside of the slide cover, which may be printed onto the slide cover by vapor deposition, additive manufacturing processes such as 3D printing, or any number of other ways. A liner may be layered over the metal mesh, which may be scratch-resistant, magnetically shielded, RF shielded, or a combination of one or more of the aforementioned.

According to another aspect, an apparatus includes an ear piece case housing, a receptacle within the ear piece case housing and configured to hold an earpiece, an earpiece connector at the receptacle and configured to electrically connect with the earpiece, and electromagnetic shielding materials integrated into the ear piece case housing to electromagnetically isolate the earpiece while the earpiece is contained within the case housing. The ear piece case housing may include a charger and a removable slide cover adapted for sliding over the charger.

According to another aspect, an earpiece case housing includes a charger and a removable slide cover adapted for sliding over the charger, a first receptacle within the ear piece case housing and configured to hold a first earpiece, a second receptacle within the ear piece case housing and configured to hold a second earpiece, a first earpiece connector at the receptacle and configured to electrically connect with the first earpiece, a second earpiece connector at the receptacle and configured to electrically connect with the second earpiece, and electromagnetic shielding materials integrated into the ear piece case housing to electromagnetically isolate the earpiece while the earpiece is contained within the case housing.

One or more of these and/or other objects, features, or advantages of the present invention will become apparent from the specification and claims that follow. No single embodiment need provide each and every object, feature, or advantage. Different embodiments may have different objects, features, or advantages. Therefore, the present invention is not to be limited to or by an object, feature, or advantage stated herein.

DETAILED DESCRIPTION

Figure 1:
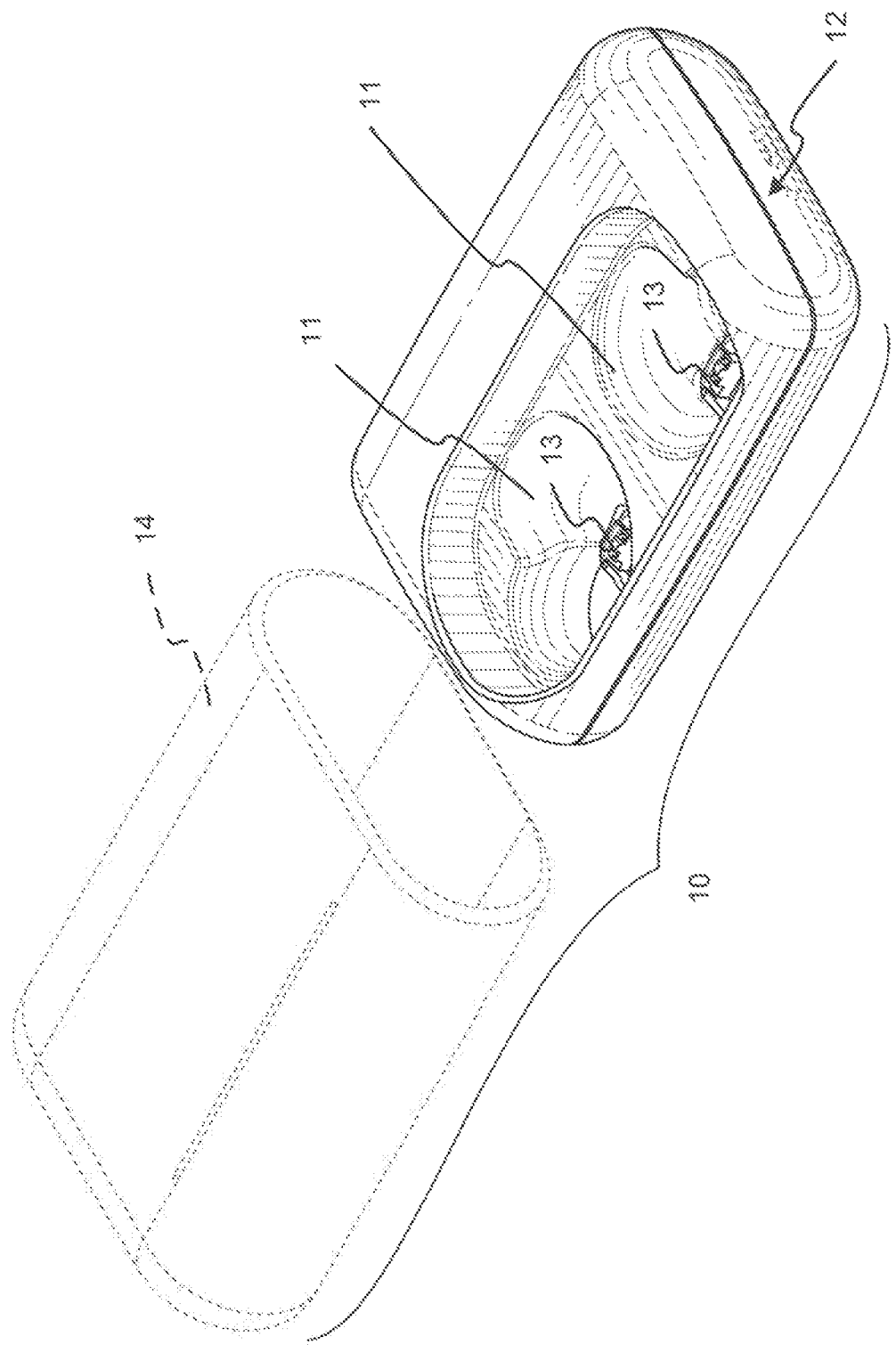
FIG. 1 includes a view of an earpiece case housing have a slide cover and a charger.
Figure 2:
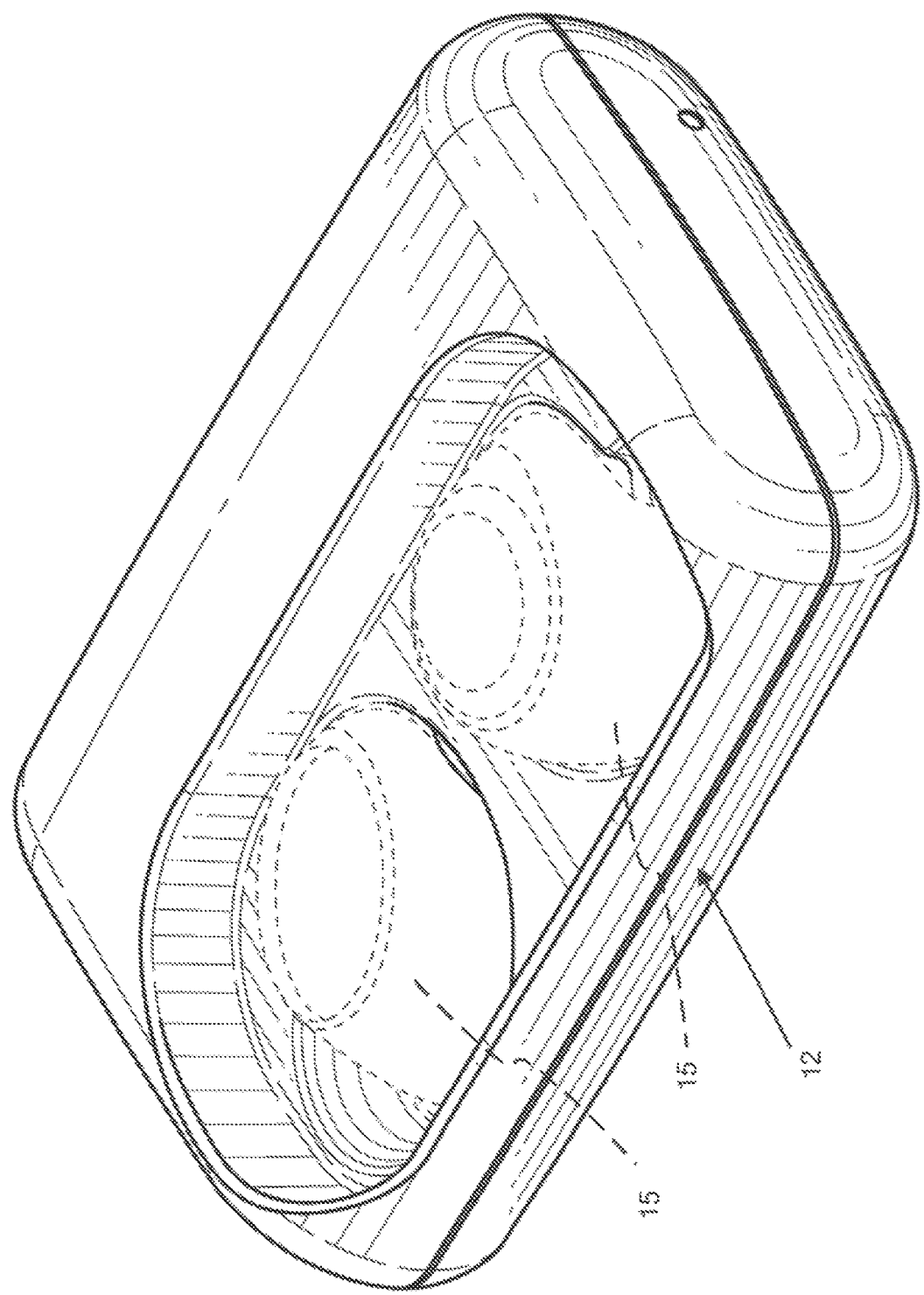
FIG. 2 illustrates the charger adapted for receiving earpieces.

The present invention provides an earpiece case with shielding. FIG. 1 illustrates one embodiment of the earpiece case housing 10 which includes a charger 12 and a slide cover 14. The charger 12 includes receptacles 11 for placing left and right earpieces. When the left and right earpieces (not shown) are placed within the charger 12, connections are made between contact points on the earpieces and connectors 13. The connectors 13 may be magnetic connectors to make it easier for a user to properly connect the earpieces to the earpiece case housing. Thus, when the earpieces are placed in the charger 12 the earpieces may be charged by the charger 12 such as by using a battery also disposed within the charger 12, or through connecting the charger 12 to a power source such as a USB power source 22, or other type of power source. In addition, data may be communicated through the connectors 13 as well for various purposes including to upload data to or download data from the earpieces. FIG. 2 further illustrates the charger 12 configured to receive earpieces 15 into its receptacles.

Figure 3A:
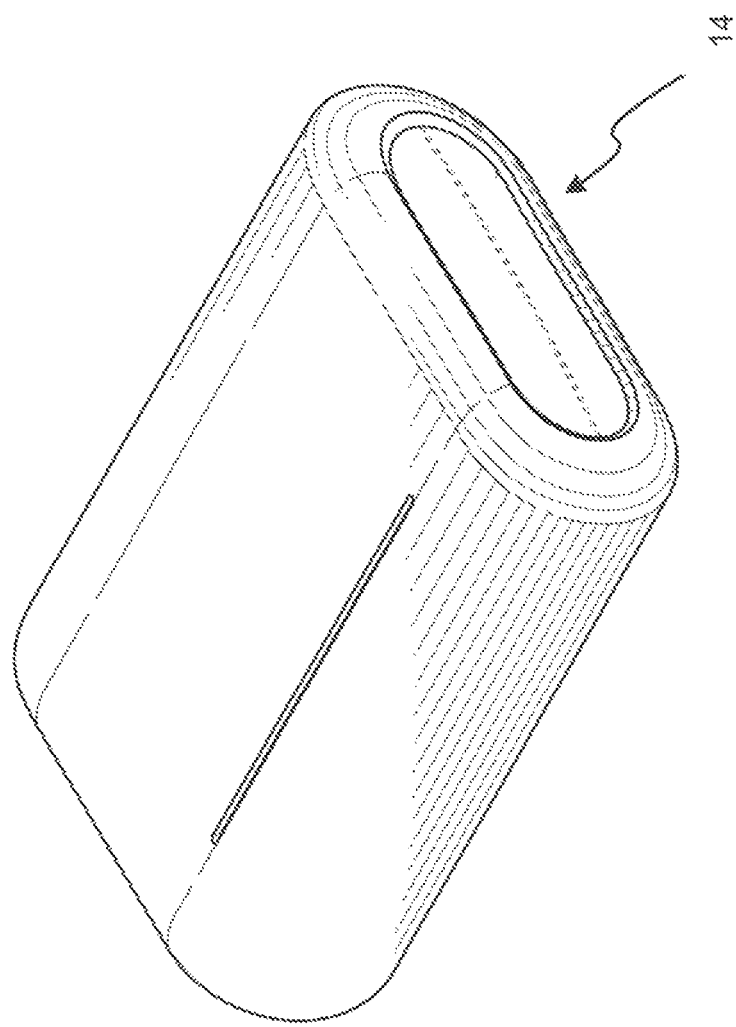
FIG. 3A illustrates one example of the slide cover.
Figure 3D:
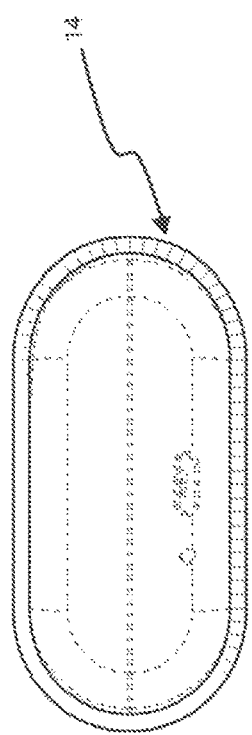
Figure 3E:
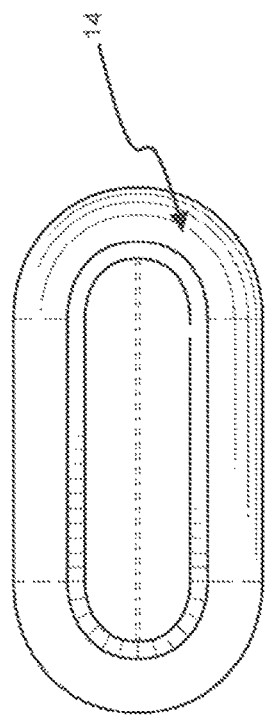
Figure 3B:
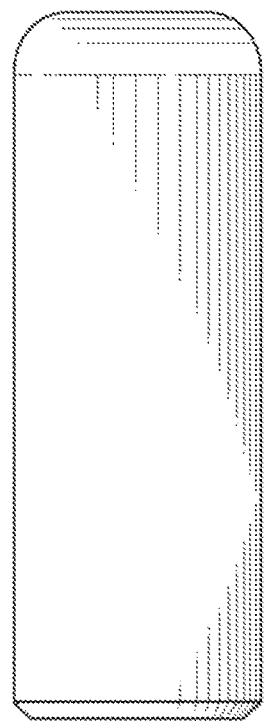
Figure 3C:
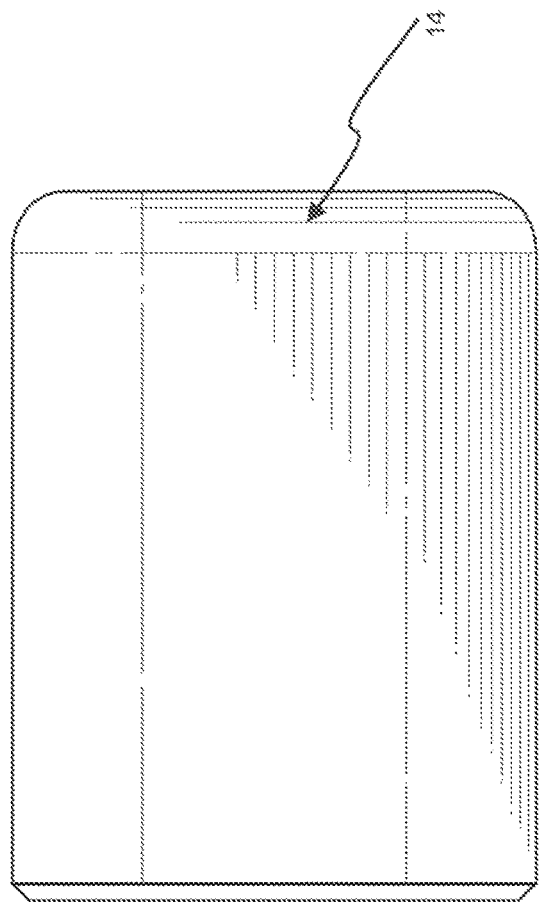

FIGS. 3A-3E illustrates the slide cover 14 used to encase a smart case 12 (not shown). The slide cover 14 includes shielding which can serve several different functions. First, the magnetic shielding may be used to shield objects outside of the earpiece case from any effects of the magnetic connectors 13. Second, the shielding may be used to shield the wireless earpieces which may include one or more radio transceivers in at least one of the earpieces from connecting with other devices while the earpieces are within the earpiece case and not in use. Thus, for example, while the earpieces are within the earpiece case, a mobile phone or computer which is sometimes paired via Bluetooth the one or both of the earpieces would not be able to find the earpieces or try to connect with the earpieces or vice versa. FIG. 3A shows three- dimensional view of the slide cover 14. The smart case 12 may be placed into the slide cover 14 through an open side (not shown in this particular figure). FIG. 3B shows a side view of the slide cover 14. FIG. 3C shows an overhead view of the slide cover 14. FIG. 3D shows the open side of the slide cover 14. Two apertures for the status light and the power source connector are shown. FIG. 3E shows the back of the slide cover 14.

The slide cover 14 may be constructed in various ways in order to provide shielding. For example, the slide cover 14 may be formed from a high permeability such as an alloy having high nickel content (e.g. 50 percent or more). Examples of alloys which may be used include Permalloy and Mu-Metal. Of course, any number of other materials may be used provided they allow for adequate shielding. The slide cover 14 may also include mesh material to provide RF shielding and/or a liner.

Figure 4:
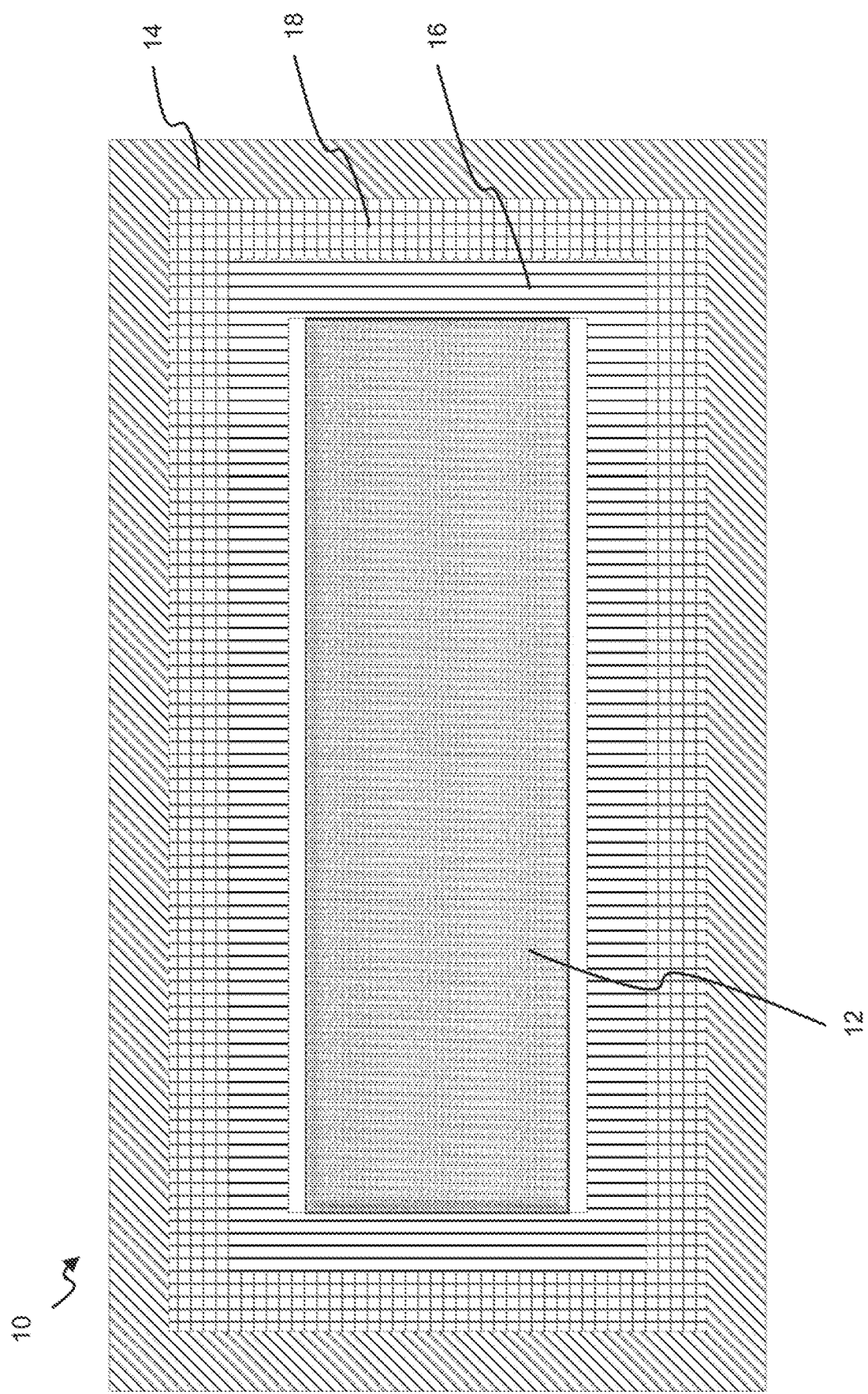
FIG. 4 illustrates a cross-section of the earpiece case housing including a liner and a filter.

FIG. 4 shows a cross-sectional view of the ear piece case 10, including the charger 12 and the slide cover 14. The charger 12 may be placed, positioned, or disposed within the slide cover 14 and may be removed from or placed into the slide cover 14 as needed by a user. The charger 12 may be configured to hold one or more earpieces, and may have one or more electrical components installed that may be used to power, operate, or otherwise control an earpiece. The slide cover 12 may be manufactured using scratch-resistant materials, or any materials that would reduce the likelihood of becoming damaged, and may be configured to withstand the force of impact from falls without becoming damaged to the point of inoperability. In addition, the charger 12 may have magnetic and radiofrequency (RF) shielding in addition to any shielding the slide cover 14 provides in order to improve the operability of an earpiece. For example, one or more ends of the charger 12 may have shielding. The charger 12 may also be readily transportable by the user. The slide cover 14 may be configured to encase the charger 12. The slide cover 14 may be composed of scratch-resistant materials, magnetic shielding materials, and/or RF shielding materials depending on the requirements of a prospective user.

The slide cover 14 may have a liner 16 attached to the inside of the slide cover 14 and/or a metal mesh 18 attached to the inside of the slide cover 14, with the liner 16 layered over the metal mesh 18. The liner 16, may include shielding materials, such as magnetic shielding materials or RF shielding materials. Where used, a metal mesh 18 may be attached to the slide cover 14 wherein the apertures are sized, shaped, positioned, or otherwise configured to block EM radiation such as radio waves, especially radio signals at frequencies associated with Bluetooth, or matching the frequencies of the wireless transceiver(s) of the earpiece(s).

The charger 12 may also have one or more additional components installed within, including, but not limited to, a processor, a battery, a data storage device, one or more sensors, a display, or one or more transceivers. The processor may be used to monitor or control one or more earpieces present within the earpiece case housing. The battery may be used to power the processor and other components present within the earpiece case housing or power one or more earpieces present within one or more receptacles of the earpiece case housing. The data storage device may be used to store programs used to modify, monitor, operate, or otherwise control one or more earpieces present in the earpiece case housing. One or more transceivers may be used to communicate with the earpiece case housing when the case is not shielded. One or more sensors may be used to determine when the slide cover 14 removed and potentially terminate the powering of any earpieces present within the earpiece case housing or even to turn one or more of the earpieces on. The charger may also include one or more status lights and/or one or more power or data connectors. The status light may show the status of the power within the earpiece case housing. For example, the status light may illuminate green when the charger is fully charged, yellow when the charger is less than fully charged, and red when the smart case is in need of power. The status light need not have more than one color, however; a single color light that conveys information through changes in luminescence intensity or intermittent flashing may also be used. For example, a solid light may represent a fully charged battery, a light of lower luminescence may represent a less than fully charged battery, wherein the luminescence gradually falls in proportion to the battery level, and a flashing light may represent that the battery needs to be recharged, wherein the flashing may become faster and more pronounced the closer the battery is to running out of power. The power source connector may be configured to connect any type of electrical wiring that is suitable for the earpiece case housing.

According to another embodiment instead of a slide cover, the smart case may be of a clamshell design. One or more hinges may be present to hinge a top portion of the smart case to a bottom of the smart case. The case housing includes at least one receptacle configured to hold an earpiece and at least one connector for each earpiece. The shielding materials may be integrated into smart case to provide for shielding. The case housing may include a first portion and a second portion wherein the first portion and the second portion are moveable with respect to each other to define an open position and a closed position. One of the first portion and the second portion may be a slide cover. The other of the first portion and the second portion may be a charger. Alternatively, the first portion and the second portion may be, for example, a top portion of a clamshell case and a bottom portion of a clamshell case. Of course, any number of other types of configurations are contemplated.

Therefore, a smart case for earpieces has been shown and described which includes magnetic shielding. Although various embodiments have been described, the present invention contemplates numerous options, additions, and variations.

What is claimed is:

1. An apparatus comprising:
    an ear piece case housing;
    wherein the ear piece case housing comprises a charger and a removable slide cover adapted for encasing the charger, the charger having a top and an opposite bottom and first and second opposite sides, the bottom side comprising a flat surface and wherein the removable slide cover having a top and a bottom and a first side opening adapted to slide over the first side of the charger and an opposite second side opening smaller than the first side opening;
    a receptacle within a recess within the top of the charger, the receptacle configured to hold an earpiece;
    an earpiece connector at the receptacle and configured to electrically connect with the earpiece; and
    electromagnetic shielding materials integrated into the charger of the ear piece case housing to electromagnetically isolate the earpiece while the earpiece is contained within the ear piece case housing.

2. The apparatus of claim 1 wherein the removable slide cover comprises a second electromagnetic shielding material.

3. The apparatus of claim 2 wherein the second electromagnetic shielding material comprises a nickel alloy.

4. The apparatus of claim 3 wherein the nickel alloy comprises at least 30 percent nickel.

5. The apparatus of claim 2 wherein the removable slide cover comprises a liner.

6. The apparatus of claim 2 wherein the removable slide cover comprises a layer of metal mesh as the second electromagnetic shielding material.

7. The apparatus of claim 6 wherein the layer of metal mesh is printed onto an inside surface of the removable slide cover.

8. The apparatus of claim 2 wherein the removable slide cover comprises a liner and a layer of metal mesh.

9. An apparatus comprising:
   an earpiece case housing comprising a charger and a removable slide cover adapted for encasing the charger, the charger having a top and an opposite bottom and first and second opposite sides, the bottom side comprising a flat surface and wherein the removable slide cover having a top and a bottom, a first side opening configured to slide over the charger, and an opposite second side opening smaller than the first side opening;
   a first receptacle within a recess within the top of the charger, the first receptacle configured to hold a first earpiece;
   a second receptacle within the recess within the top of the charger and spaced apart from the first receptacle, the second receptacle configured to hold a second earpiece while the first receptacle holds the first earpiece without contact between the first earpiece and the second earpiece;
   a first magnetic earpiece connector at the first receptacle and configured to electrically connect and communicate data with the first earpiece;
   a second magnetic earpiece connector at the second receptacle and configured to electrically connect and communicate the data with the second earpiece;
   electromagnetic shielding materials integrated into the ear piece case housing to electromagnetically isolate the first earpiece and the second earpiece while the first earpiece and the second earpiece are contained within the earpiece case housing.

10. The apparatus of claim 9 wherein the slide cover comprises the electromagnetic shielding materials.

11. The apparatus of claim 10 wherein the slide cover comprises a layer of metal mesh to provide electromagnetic shielding.

12. The apparatus of claim 11 wherein the layer of metal mesh is printed on an inside surface of the slide cover.

13. The apparatus of claim 12 wherein the slide cover further comprises a liner inside of the layer of metal mesh.

14. An apparatus comprising:
   an ear piece case housing comprising a charger and a slide cover, the charger having a top and an opposite bottom and first and second opposite sides, the bottom side comprising a flat surface and wherein the slide cover having a top and a bottom, a first side opening configured to slide over the charger, and an opposite second side opening smaller than the first side opening;
   a battery disposed within the charger;
   a USB port positioned on a first side of the charger proximate to the first side opening of the slide cover and accessible when the slide cover encircles the charger;
   a receptacle within the ear piece case housing and configured to hold an earpiece;
   an earpiece connector at the receptacle and configured to electrically connect and communicate data with the earpiece; and
   electromagnetic shielding materials integrated into the ear piece case housing to electromagnetically isolate the earpiece while the earpiece is contained within the ear piece case housing.

15. The apparatus of claim 14 wherein the charger further comprises a processor disposed within the charger and a data storage device disposed within the charger.

* * * * *